United States Patent
Kim et al.

(10) Patent No.: US 10,635,773 B1
(45) Date of Patent: Apr. 28, 2020

(54) ENHANCING STABILITY OF HALF PERIMETER WIRE LENGTH (HPWL)-DRIVEN ANALYTICAL PLACEMENT

(71) Applicant: INTERNATIONAL BUSINESS MACHINES CORPORATION, Armonk, NY (US)

(72) Inventors: Myung-Chul Kim, Travis, TX (US); Paul G. Villarrubia, Austin, TX (US); Shyam Ramji, LaGrange, NY (US); Gi-Joon Nam, Chappaqua, NY (US); Benjamin Neil Trombley, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/164,780

(22) Filed: Oct. 18, 2018

(51) Int. Cl.
 *G06F 17/50* (2006.01)
(52) U.S. Cl.
 CPC ........ *G06F 17/5072* (2013.01); *G06F 17/505* (2013.01)
(58) Field of Classification Search
 USPC .................................. 716/104, 113, 114, 118
 See application file for complete search history.

(56) References Cited

U.S. PATENT DOCUMENTS

| | | | | |
|---|---|---|---|---|
| 5,392,222 A | * | 2/1995 | Noble ................. | G06F 17/5068 716/52 |
| 5,984,510 A | * | 11/1999 | Guruswamy ....... | G06F 17/5068 716/104 |
| 6,006,024 A | * | 12/1999 | Guruswamy ....... | G06F 17/5068 716/126 |
| 6,154,873 A | * | 11/2000 | Takahashi ........... | G06F 17/5068 716/118 |
| 6,209,123 B1 | * | 3/2001 | Maziasz .............. | G06F 17/5068 716/123 |

(Continued)

OTHER PUBLICATIONS

Spindler et al., Kraftwerk2—A fast force-directed quadratic placement approach using an accurate net model, IEEE Transactions on Computer-Aided Design of Integrated Circuits and Systems, vol. 27, No. 8, pp. 1398-1411, 2008.

(Continued)

*Primary Examiner* — Brian Ngo
(74) *Attorney, Agent, or Firm* — Steven Meyers; Otterstedt, Wallace & Kammer, LLP

(57) ABSTRACT

The performance of a computer performing electronic design analysis is improved by representing a putative circuit design as a set of movable blocks of predetermined size which must fit into a bounding box (said blocks include a plurality of subsets to be interconnected by wires) and initially placing the set of blocks by quadratic initialization. Each of the blocks has first and second coordinates and weights are assigned to nets connecting those of the blocks within the subsets, the quadratic initialization in turn includes determining a cost of each of the nets connecting any two of the blocks within the subsets as one-half of a sum of squares of distances between the any two of the blocks; and minimizing a total cost over all of the nets to determine an initial placement of the set of blocks. Analytical placement is then carried out based on the initial quadratic placement.

20 Claims, 9 Drawing Sheets

(56) References Cited

U.S. PATENT DOCUMENTS

| | | | |
|---|---|---|---|
| 6,282,693 | B1 | 8/2001 | Naylor |
| 6,301,693 | B1 | 10/2001 | Naylor |
| 6,671,859 | B1 | 12/2003 | Naylor |
| 7,073,144 | B2 | 7/2006 | Alpert |
| 7,934,188 | B2 | 4/2011 | Alpert |
| 8,595,675 | B1 | 11/2013 | Alpert |
| 2003/0226127 | A1* | 12/2003 | Idani ............... G06F 17/5068 716/54 |
| 2005/0108669 | A1* | 5/2005 | Shibuya ........... G06F 17/5068 716/113 |
| 2006/0190899 | A1* | 8/2006 | Migatz ................. G06F 1/10 716/114 |
| 2010/0017774 | A1* | 1/2010 | Bachina ........... G06F 17/5054 716/128 |
| 2011/0239177 | A1 | 9/2011 | Chong |
| 2016/0004626 | A1 | 1/2016 | Jain |

OTHER PUBLICATIONS

Ray, B. B., et al. (Dec. 2015). An Optimized HPWL Model for VLSI Analytical Placement. In Information Technology (ICIT), 2015 International Conference on (pp. 7-12). IEEE.

Anonymous, IPCOM000244046D "Method and apparatus for improving wirelength and frequency in circuit design", Nov. 9, 2015.

Sigl, G. et al (Jun. 1991). Analytical placement: A linear or a quadratic objective function?. In Proceedings of the 28th ACM/IEEE Design Automation Conference (pp. 427-432). ACM.

Kim, M. C et al. (Mar. 2012). MAPLE: multilevel adaptive placement for mixed-size designs. In Proceedings of the 2012 ACM international symposium on International Symposium on Physical Design (pp. 193-200). ACM.

Kahng, A. et al. (Apr. 2005). Aplace: A general analytic placement framework. In Proceedings of the 2005 international symposium on Physical design (pp. 233-235). ACM.

Viswanathan, N. et al. (2005). FastPlace: efficient analytical placement using cell shifting, iterative local refinement, and a hybrid net model. IEEE Transactions on Computer-Aided Design of Integrated Circuits and Systems, 24(5), 722-733.

Chen, T. C. et al. (2008). NTUplace3: An analytical placer for large-scale mixed-size designs with preplaced blocks and density constraints. IEEE Transactions on Computer-Aided Design of Integrated Circuits and Systems, 27(7), 1228-1240.

Kim, M. C. et al. (2012). SimPL: An effective placement algorithm. IEEE Transactions on Computer-Aided Design of Integrated Circuits and Systems, 31(1), 50-60.

Lu, J. et al.(Jun. 2014). ePlace: Electrostatics based placement using Nesterov's method. In Proceedings of the 51st Annual Design Automation Conference (pp. 1-6). ACM.

Wikipedia—Conjugate Gradient Method, Description of the problem addressed by conjugate gradients, 14 pages.

Lin, T. et al. (Nov. 2013). POLAR: Placement based on novel rough legalization and refinement. In Proceedings of the International Conference on Computer-Aided Design (pp. 357-362). IEEE Press.

Wikipedia—Successive over-relaxation, 6 pages.

Wikipedia—Quadratic programming, 6 pages.

* cited by examiner

| Design | Baseline (801) | With Quad. Init. (803) | Improvement (%) |
|---|---|---|---|
| DESIGN 1 | 44695.344 | 42799.857 | 4.24 |
| DESIGN 2 | 48571.277 | 44452.924 | 8.48 |
| DESIGN 3 | 25483.070 | 13663.447 | 46.38 |

ENHANCING STABILITY OF HALF PERIMETER WIRE LENGTH (HPWL)-DRIVEN ANALYTICAL PLACEMENT

BACKGROUND

The present invention relates to the design of integrated circuits (ICs), and more specifically, to placement analysis of such circuits.

In VLSI (very large scale integration) digital design, a netlist (from logic synthesis) includes a network of combinational logic gates and memory elements such as latches/flip-flops. The placement stage determines the locations of all modules in the netlist (modules and their interconnect(s)), generated from logic synthesis. Typically, the primary objective of placement is to optimize wire length, subject to the constraint of no overlap(s) between modules. If the placement stage is unstable, it can generate very different placements even with minor changes in the netlist (e.g., netlist reordering, module insertion, fanout optimization, etc.).

To estimate the final routed wire length, the Half-Perimeter Wire Length (HPWL, or bounding box model) is commonly used and optimized during placement, mainly due to its accuracy and efficiency. Modern HPWL-driven analytical placement exhibits instability with the change of design/netlist.

SUMMARY

Principles of the invention provide techniques for enhancing stability of half perimeter wire length (HPWL)-driven analytical placement. In one aspect, an exemplary method of improving the performance of a computer performing electronic design analysis includes representing a putative circuit design as a set of movable blocks of predetermined size which must fit into a bounding box, the set of movable blocks including a plurality of subsets to be interconnected by wires; initially placing the set of movable blocks by quadratic initialization, wherein each of the movable blocks has first and second coordinates and weights are assigned to nets connecting those of the movable blocks within the subsets, the quadratic initialization in turn including: determining a cost of each of the nets connecting any two of the movable blocks within the subsets as one-half of a sum of squares of distances between the any two of the movable blocks; and minimizing a total cost over all of the nets to determine an initial placement of the set of movable blocks; and carrying out analytical placement based on the initial placement.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) (e.g., a computer) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

use of quadratic placement to enhance placement stability;

reduced design cycle time;

improved performance of a computer carrying out Electronic Design Automation (EDA) because the analysis will converge faster and less CPU time will be used; and improved performance of integrated circuits designed using aspects of the invention, as compared to those not designed using aspects of the invention, at least under conditions where there is the same CPU time budget for the design process.

These and other features and advantages of the present invention will become apparent from the following detailed description of illustrative embodiments thereof, which is to be read in connection with the accompanying drawings.

DETAILED DESCRIPTION

One or more embodiments advantageously provide techniques for enhancing stability of half perimeter wire length (HPWL)-driven analytical placement.

Figure 1:
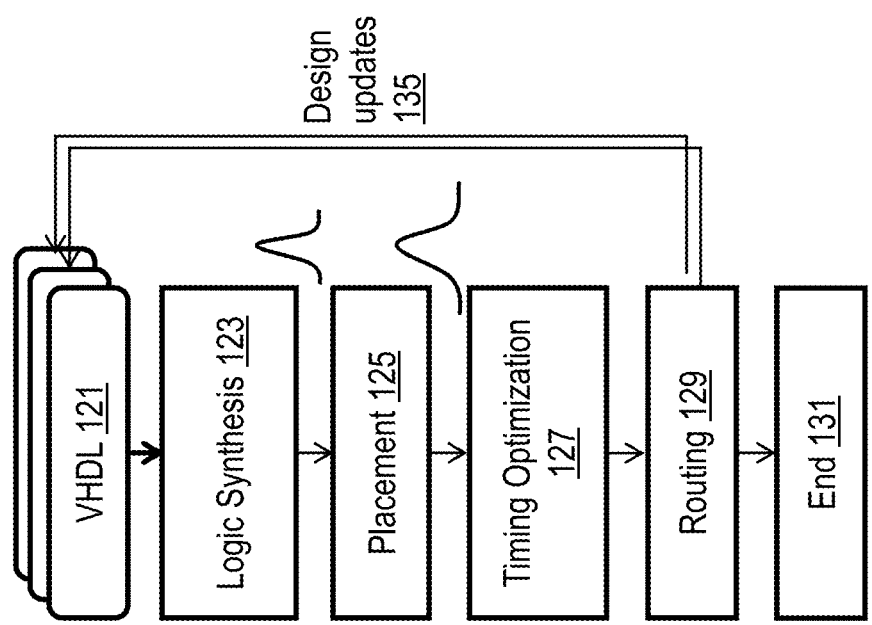
FIG. 1 shows a design flow in which aspects of the invention can be used to enhance stability of the placement stage.

FIG. 1 shows a design flow wherein placement is enhanced in accordance with aspects of the invention. Design closure often requires multiple iterations of a design flow, wherein incremental changes in the design and/or netlist (modules and their interconnect(s)) are made based on information from the previous iteration. The stability issue comes into effect, since each stage in a flow is expected to be stable; i.e., it should generate similar outputs with small, incremental changes in design inputs.

FIG. 1 depicts a simplified physical synthesis flow, and considers how placement is used in physical synthesis. In VLSI digital design, a netlist (from logic synthesis) includes a network of combinational logic gates and memory elements such as latches/flip-flops. In step 121, describe the design in a language such as VHDL. In step 123, carry out logic synthesis. In step 125, carry out placement. Regarding placement, the netlist is presented as sea-of-standard cells (nodes) with connectivity matrix (edges) for placement during physical design. The placement stage determines the location of cells with the objective to optimize wire the length while spreading cells to resolve overlaps and meet the density constraint. In one or more embodiments, placement step 125 is enhanced by a pre-processing technique disclosed herein. In step 127, carry out timing optimizations. In step 129, carry out routing. In step 135, iteratively update the design, with feedback to step 121. The ultimate result is a layout; the end is depicted at 131.

One or more embodiments advantageously focus on the placement stage 125. The placement stage determines the locations of all modules in the netlist (modules and their interconnect(s)), generated from logic synthesis 123. In one or more embodiments, the primary objective is to optimize wire length, subject to the constraint of no overlap(s) between modules. If the placement stage is unstable, it can generate very different placements even with minor changes in the netlist (e.g., netlist reordering, module insertion, fanout optimization, etc.).

Figure 2:
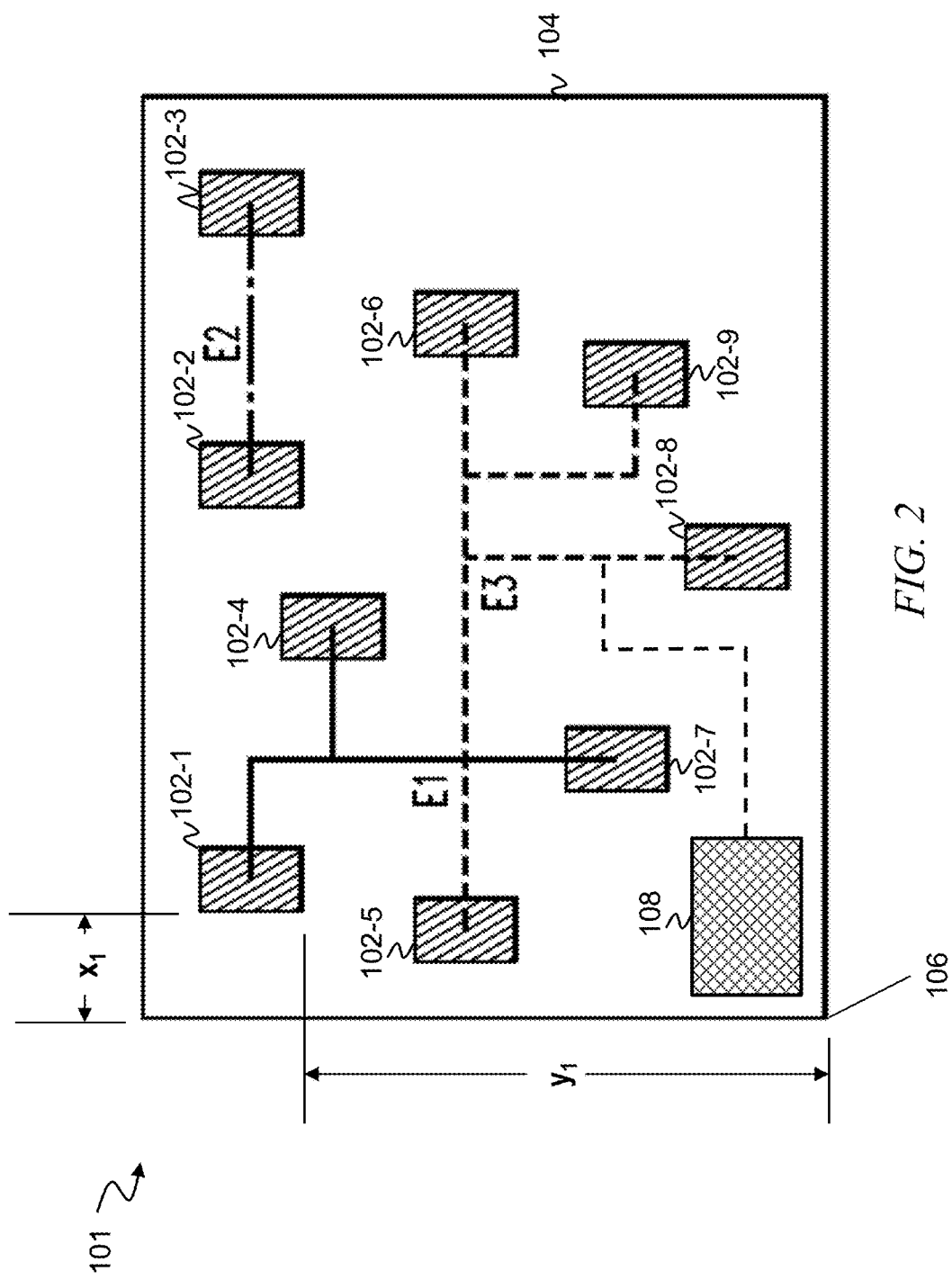
FIG. 2 shows a circuit in placement, wherein placement can be effectuated by aspects of the invention.

Referring to FIG. 2, a circuit 101 in placement is represented as a set of movable rectangles or blocks (shown cross-hatched and numbered 102-1, 102-2, 102-3, 102-4, 102-5, 102-6, 102-7, 102-8, and 102-9) with given widths and heights which must fit into a bounding box 104. This set is denoted by V. In addition to V itself, a number of subsets of V: E1, E2 . . . Em (in the figure, E1, E2, E3) are given and are called nets. Blocks of each net should be connected by wires (lines shown connecting cross-hatched rectangles and not separately numbered to avoid clutter). A good placement should minimize the total wire length without creating regions overpopulated with blocks anywhere in the design. There can also be one or more fixed blocks 108.

Finding an exact minimum wire length, also called Steiner wire length, is a computationally expensive task even if the blocks are fixed, so in current placement tools it is traditionally replaced by the Half Perimeter Wire Length (HPWL) approximation:

$$HPWL(net):=\max(x\_i)-\min(x\_i)+\max(y\_i)-\min(y\_i) \quad (1)$$

$$HPWL(design)=\text{summation\_over\_all\_nets}(HPWL(net)) \quad (2)$$

One or more embodiments take the following information as input:
the Block-Net hypergraph G(V, E),
the sizes of movable blocks and of the design bounding box, and
the positions of fixed blocks and the positions of pins in each block with respect to the block's anchor point (e.g. the lower left corner or the center, but other points (e.g., center) could be used if desired—FIG. 2 uses the lower left-hand corner 106 of the bounding box 104 and the lower left-hand corners of the blocks as well).

One or more embodiments produce, as output, the coordinates (x_i, y_i) of lower left corners (or other predetermined point) of all movable blocks with respect to the lower left corner 106 (or other predetermined point) of the bounding box for an initial placement.

Figure 3:
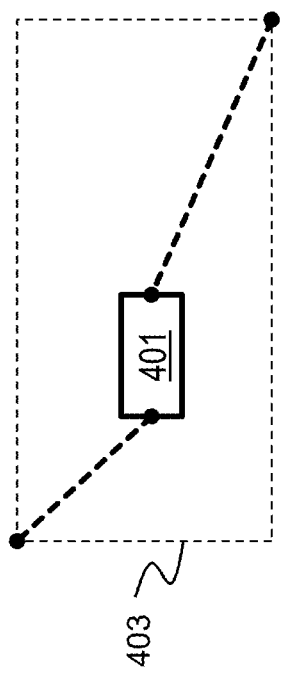
FIG. 3 illustrates a Half-Perimeter Wirelength (HPWL, or bounding box model) used and optimized during placement in aspects of the invention.

Modern placement algorithms typically employ HPWL-driven analytical placement. Referring to FIG. 3, to estimate the final routed wire length, the Half-Perimeter Wire Length (HPWL, or bounding box model) is commonly used and optimized during placement, mainly due to its accuracy and efficiency. Note block to be placed 401 and bounding box 403.

Analytical placement is a class of placement algorithms that model the HPWL with closed-form formulas and optimize analytically. For example, approximate the HPWL with relaxed quadratic wire length, log-sum-exponent, weighted average, etc. Analytical placement employs analytical, mathematical techniques for optimization such as quadratic, non-linear programming, conjugate-gradient, Nesterov's Method, etc.

In a non-limiting example, the quadratic initialization techniques set forth herein fit into the LFDP (Linear Force Driven Placement) placement flow (or similar placement flows from International Business Machines Corporation or vendors such as Cadence or Synopsys) as follows: quadratic initialization, global placement, followed by iterative local refinement (see, e.g., Natarajan Viswanathan, Member, IEEE, and Chris Chong-Nuen Chu, FastPlace: Efficient Analytical Placement Using Cell Shifting, Iterative Local Refinement, and a Hybrid Net Model, IEEE TRANSACTIONS ON COMPUTER-AIDED DESIGN OF INTEGRATED CIRCUITS AND SYSTEMS, VOL. 24, NO. 5, MAY 2005, pages 722-733), followed by legalization, followed by detailed placement. Current placement flows typically include initial analytical global placement, local placement refinement, legalization, and detailed placement. Current widely-adopted analytical global placement often can be post-processed by local refinement techniques (e.g. FastPlace: An Analytical Placer for Large-scale VLSI Circuits; DPlace2.0: A stable and efficient analytical placement based on diffusion; MAPLE: Multilevel Adaptive PLacEment for Mixed-Size Designs).

Figure 5:
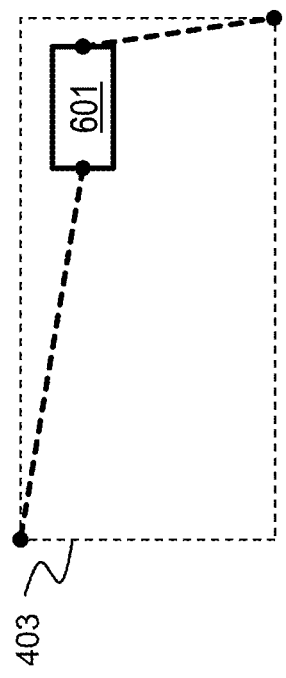
FIGS. 4 and 5 show how two different placement solutions can have the same HPWL, effectively becoming a source of instability in analytical placement which can be addressed by embodiments of the invention.
Figure 4:
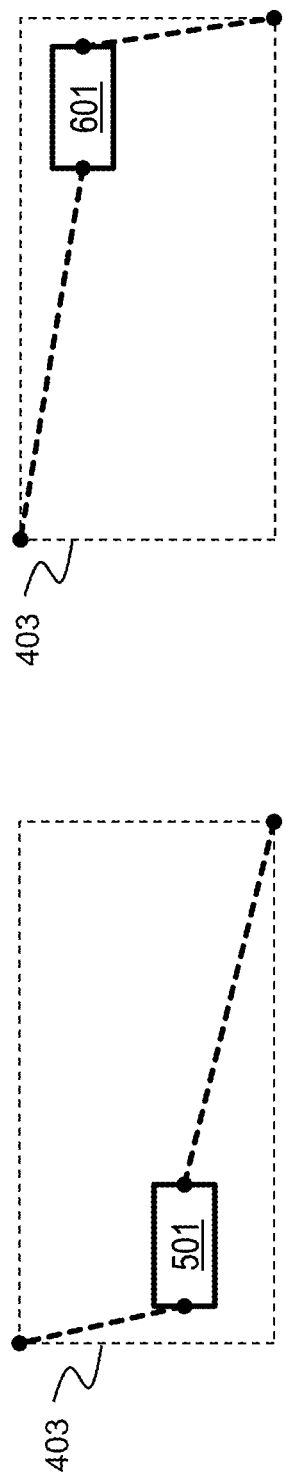

Referring now to FIGS. 4 and 5, modern HPWL-driven analytical placement exhibits instability with the change of design/netlist. Small, incremental design/netlist changes can create radically different placement solutions, which delays the overall chip design closure. Natively, there could be multiple placement solutions that still have the same HPWL. Therefore, HPWL optimization is dependent on the initial placement. This effectively becomes a source of instability in analytical placement. Note that blocks to be placed 501, 601 and bounding box 403 in each of FIGS. 5 and 6 have the same HPWL, yet a different location within the boundary 403 of each block to be placed 501, 601.

Analytical placement is widely adopted due to its superior performance; however, its stability aspect has been overlooked. Heretofore, analytical placement in academic literature has assumed arbitrary/random/unstable HPWL-optimized initial placement. Otherwise, no direct reference to stability has been found in the choice of initial placements.

Current techniques typically find proper spreading forces and apply them to the program, then analytically solve the modified optimization problem, during conditions when the target congestion is not met. Furthermore in this regard, as will be appreciated by the skilled artisan, there are conflicting goals in placement: short wire length drives all the movable blocks/components to be located close together; however, excessive congestion will result in thermal hot spots and/or routing difficulties due to insufficient space between blocks/components. Typically, "spreading forces" are used to address these conflicting goals. Designers typically set a certain target density which should be met by the placement tool. Thus, as will be appreciated by the skilled artisan, modern analytical placement typically employs two competing forces in the placement model; namely, the spreading force to prevent congestion and the wire length minimization force to minimize wire length, subject to avoiding excessive congestion. As is familiar to the skilled artisan, these are not physical forces but mathematical concepts used to place the movable blocks.

Figure 6:
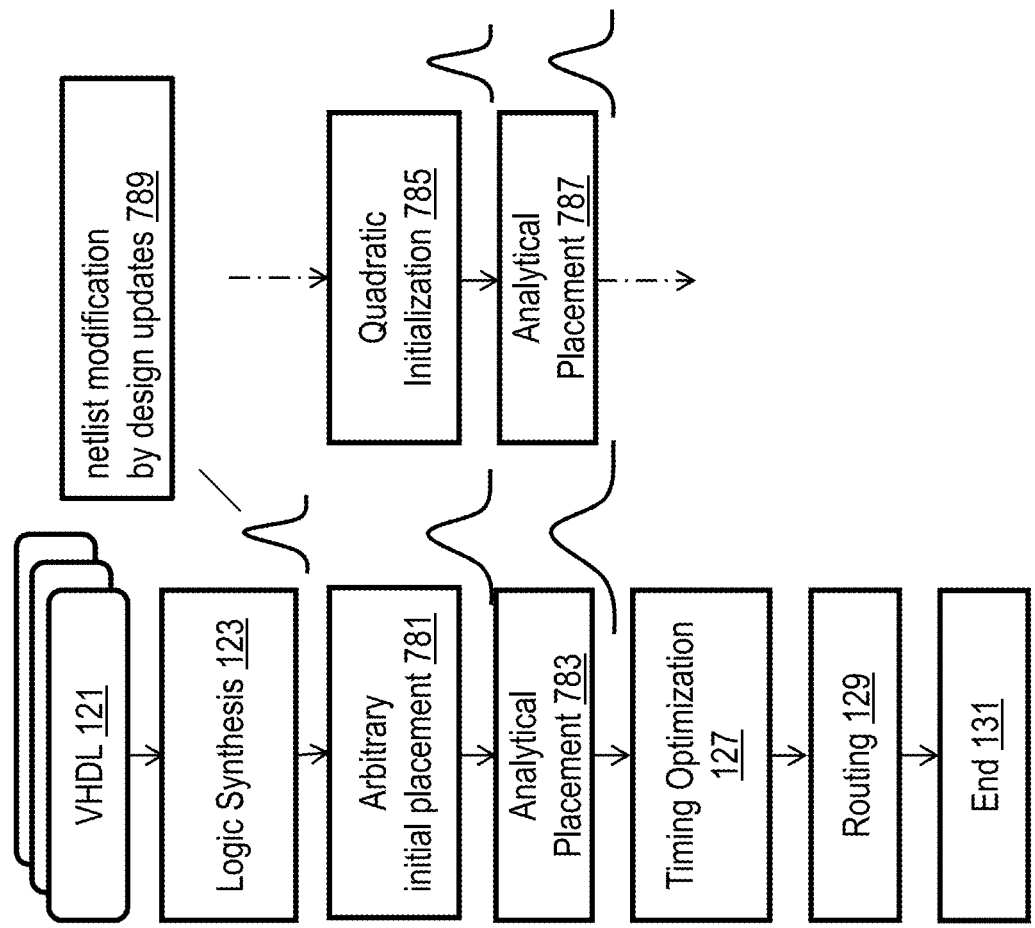
FIG. 6 shows a design flow wherein stability of the placement stage is enhanced via quadratic initialization in accordance with aspects of the invention.

Referring now to FIG. 6, one or more embodiments advantageously enhance placement stability through an inventive pre-processing step. One or more embodiments employ quadratic initialization 785; i.e., application of mathematical optimization of quadratic wire length on an input netlist. The output of quadratic initialization is a placement that works as an initial input to the main analytical placers, as seen at 787. Compare to arbitrary initial placement 781 followed by analytical placement 783, as might be encountered in current techniques. Steps 121, 123, 783/787, 127, and 129 can be performed by known EDA software from International Business Machines Corporation, Cadence, Synopsys, etc., as will be familiar to the skilled artisan. One or more embodiments advantageously employ Quadratic wire length optimization. Unlike HPWL, with a stable solver implementation, quadratic wire length optimization mathematically converges to a unique solution (i.e., is strictly convex). With incrementally varying designs/netlist, quadratic wire length optimization effectively finds similar placement solutions.

In quadratic wire length optimization, if
($x_i$, $y_i$)=Coordinates of movable object i,
$w_{ij}$=Weight (given) of the net connecting objects i and j, and
x, y=Solution vectors
then the cost of the net between object i and object j is given by:

$$\tfrac{1}{2} w_{ij}((x_i-x_j)^2 + (y_i-y_j)^2) \quad (3)$$

Furthermore, the total cost is given (in matrix form) by:

$$\tfrac{1}{2} x^T Q x + d_x^T x + \tfrac{1}{2} y^T Q y + d_y^T y \quad (4)$$

Expression (4) can be solved (optimized by minimizing cost) using a number of known mathematical optimization techniques; e.g., quadratic programming techniques. Examples include conjugate gradient-based optimization; successive over-relaxation (SOR); or other iterative techniques or the like to find the x, y locations that minimize Expression (4). There may be many (e.g. order of millions) movable blocks so iterative optimization techniques are believed to be preferable. Referring again to FIG. 2, there are nine object to be placed; namely, 102-1, 102-2, 102-3, 102-4, 102-5, 102-6, 102-7, 102-8, and 102-9. Each will have coordinates $x_i$, $y_i$—that is, $x_1$, $y_1$ ... $x_9$, $y_9$. To avoid clutter, only $x_1$, $y_1$ are shown. The lower left hand corner of each object and the lower left hand corner 106 of the bounding box 104 are used for consistency, but other predetermined points could be used to measure the distances.

Consider $w_{ij}$, the weight (given) of the net connecting objects i and j. Block 102-1 is on net E1 and block 102-3 is on block E2; they are not connected, and thus $W_{13}$=0. Matrix Q is the connectivity matrix. If object i and j are connected, Connectivity Matrix Q will have a non-zero entry for element $W_{ij}$. In general, $W_{ij}$=0 if the blocks are not connected, and some non-zero value if they are connected. The skilled artisan knows how to assign weights to a net based on the importance/criticality of the paths; in a non-limiting example, weights may range from 0 to 100 percent. The Q matrix is symmetric; i.e., $W_{ij}$=$W_{ji}$.

The solution vectors x, y will be the final values of x and y for each of the nine movable objects, e.g., [$x_1$, $x_2$, $x_3$, $x_4$, $x_5$, $x_6$, $x_7$, $x_8$, $x_9$] and [$y_1$, $y_2$, $y_3$, $y_4$, $y_5$, $y_6$, $y_7$, $y_8$, $y_9$] respectively.

Connectivity Matrix Q refers to the connectivity between any movable objects. The vectors $d_x^T$ and $d_y^T$ refer to the connectivity between the fixed and movable objects. For example, fixed object 108 is on net E3; it has no connectivity to objects 102-1, 102-2, 102-3, 102-4, 102-7, but has weighted connectivity to objects 102-5, 102-6, 102-8, and 102-9. Fixed objects have a predetermined location; Expressions (3) and (4) determine the x and y coordinates of movable objects—that is, vectors x, y and their transposes are only concerned with the locations of movable objects, although required connections of fixed to movable objects are taken into account in the initial placement.

In the example of FIG. 2, Q is a square nine-by-nine matrix with non-zero values for $W_{ij}$/$W_{ji}$ where i and j are connected and zero values otherwise. The vectors $d_x^T$ and $d_y^T$ will have non-zero weighted values for movable blocks 102-5, 102-6, 102-9 and 102-8 because those blocks have connectivity to fixed block 108, and zero otherwise. Since there are nine movable objects in the example, the dimension of Qx or Qy will be 9×9, which captures the connectivities between movable objects. On the other hand, vectors dx/dy capture the connectivity associated with a movable object and a negative sum of net weights with its connected fixed objects. In the example, the dimension will be 9×1. That is to say, any movable objects that are in net E3 (102-5 through 102-8) will have a non-zero entry in their row in dx/dy. Furthermore in this regard, assume E3's weight is 10, then the corresponding rows of 102-5 through 102-8 will have entries −10. The other rows will be zero. The vectors $d_x^T$ and $d_y^T$ should be in Expression (4) in front of x and y, respectively.

Thus, dx/dy captures the connectivity with movable and fixed objects, and the corresponding entry value will be a negative SUM of net weights with its connected fixed objects. For example, FIG. 2 shows a single fixed object 108, but if movable block 102-5 was connected to another fixed object, the dimension of vectors $d_x^T$ and $d_y^T$ will remain as 9×1, but simply the negation of net weight (connecting between 102-5 and the fixed object, say E10) will be added to the corresponding row of 102-5 in dx/dy, This then results in −weight_E10−weight_E3.

Note that expression (4) can include a constant in some instances but this is not relevant for the optimization process.

In one or more embodiments, use expressions (3) and (4) for initial placement 785 and then optimize HPWL using equations (1) and (2) in step 787. One or more embodiments accordingly minimize the total squared wire length by minimizing the total cost in expression (4), using conjugate gradient-based optimization; successive over-relaxation (SOR); or other iterative techniques or the like. "Cost" in this context is typically a technological (e.g., performance) cost rather than a monetary value.

In step 789, iteratively update the design, with feedback to step 121. Steps with the same reference character as those in FIG. 1 are not described again, for brevity.

Figure 7:
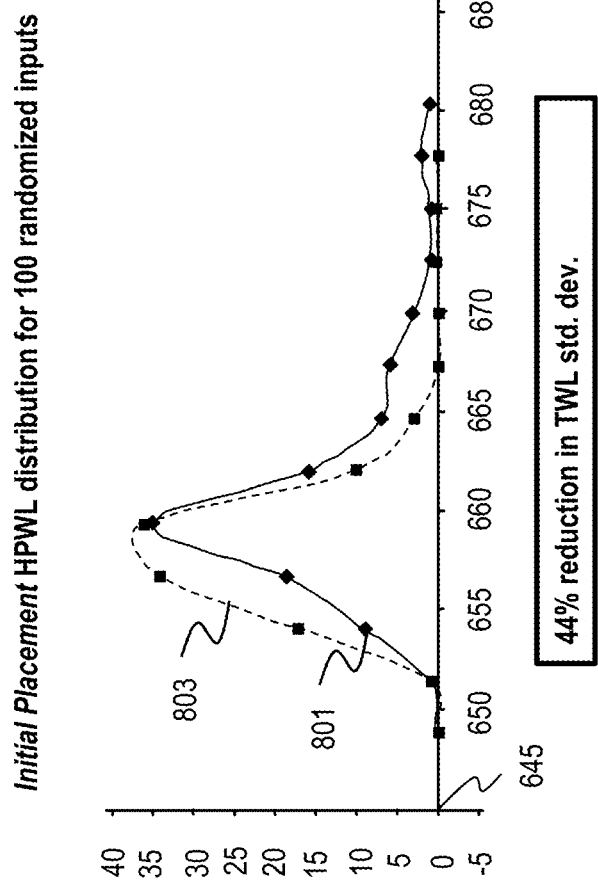
FIG. 7 shows non-limiting exemplary test results, obtained with exemplary embodiments of the invention.

FIG. 7 shows non-limiting exemplary test results. Tests were carried out with random input placements, with (curve and column 803)/without (curve and column 801) quadratic initialization. The forty random input placements effectively simulate small variations in designs/netlist changes. Stability is measured as standard deviations in final HPWL numbers after detailed placement, with and without the quadratic initialization placement pre-processing step. Note, in this non-limiting example, a 44% reduction is achieved in the standard deviation of the total wire length (TWL). One hundred blocks to be placed were randomly located and processed with and without the quadratic techniques disclosed herein. The curves 801, 803 are histograms. The horizontal axis is the half-perimeter wire length expressed in ten-thousands of design units (label 660=6,600,000 design units), while the vertical axis is the number of samples having the corresponding half-perimeter wire length. For example, curve 801 has about thirty-five instances of wire length standard deviation 6,600,000. The table of FIG. 7 shows the standard deviation in design units, for three different circuit designs (in this non-limiting example, high-performance server processor sub-macros), with and without quadratic optimization. The skilled artisan is familiar with the concept of design units and can determine same for a given technology node; for example, one design unit is typically 80 nm in the 14 nm node and typically 64 nm in the 7 nm node.

Quadratic initialization in accordance with aspects of the invention can be used as a pre-processing step to an analytical placement algorithm in PDS (Placement-driven Synthesis) flows. One or more embodiments effectively enhance the stability of a placement engine and reduce the time for design closure.

Indeed, one or more embodiments lead to at least two types of technical improvement: (i) the computer running the electronic design analysis (EDA) runs faster because of faster placement convergence; and (ii) IC chips designed with techniques according to one or more embodiments will be superior to those designed with prior art techniques because of having a shorter total HPWL, less routing congestion, and/or enhanced clock frequency as compared to circuits not designed using techniques herein, at least under conditions where there is the same CPU time budget for the design process.

Accordingly, it will be appreciated that modern analytical placers commonly optimize HPWL (Half-Perimeter Wire Length) due to its good correlation with final routed wire lengths of a chip. However, HPWL-driven optimization is natively sensitive to the given input, as there are many solutions that can possibly have the exact same HPWL. Therefore, small changes in the input netlist often can create large variations in resulting placements. Such small changes in the input netlist commonly happen during the design iterations for a chip. One or more embodiments advantageously provide techniques to enhance the stability of generic HPWL-driven analytical placement algorithms. The method is called "quadratic initialization." One or more embodiments make use of the fact that the quadratic optimization of the given netlist is mathematically stable and converges to a unique solution with a stable solver implementation, even with small netlist changes. One or more embodiments pre-process the input netlist to a placer with the quadratic initialization, which still finds similar solutions with incrementally varying inputs, and then use the solution to drive the main HPWL-driven analytical placers. Exemplary experimental results illustrate that one or more embodiments effectively improve the stability of HPWL-driven analytical placement solutions.

One or more embodiments address a problem in global analytical placement optimization, which is typically the first step in placement optimizations. It is worth noting that modern legalization is generally the last step of placement optimizations and typically does not rely on analytical approaches and thus does not suffer from stability issues. It should be noted that some prior art techniques solve the global placement problem by optimizing linear wirelengths (i.e., Half-Perimeter WL), as do embodiments of the invention; however, heretofore, prior art techniques assume random/arbitrary (placed in the center) initial placements, as opposed to the quadratically-optimized initial placement to improve stability employed in one or more embodiments. One or more embodiments address problems in global placement optimization. Local objective optimization is generally a next step of global placement optimization. Local optimizations typically do not use analytical approaches and thus do not suffer from stability issues. One or more embodiments use quadratic programming to improve the stability of linear wire length optimization. One or more embodiments advantageously employ a pure quadratic program (not relaxed to linear wire length) prior to any linear HPWL optimization. One or more embodiments use quadratically-optimized initial placement and further optimize it by optimizing linear WL. Thus, one or more embodiments use quadratically-optimized placement as a seed solution to improve stability for HPWL-driven analytical global placement.

Given the discussion thus far, it will be appreciated that, in one aspect, an exemplary method, implemented at least in part on a computer, includes representing a putative circuit design as a set of movable blocks 102-1, 102-2, 102-3, 102-4, 102-5, 102-6, 102-7, 102-8, and 102-9 of predetermined size which must fit into a bounding box 104 (see FIGS. 2-5)—the representation can be, for example, the output of logic synthesis step 123. The set of movable blocks includes a plurality of subsets (e.g. E1, E2, E3) to be interconnected by wires (see FIG. 2). A further step 785 includes initially placing the set of movable blocks by quadratic initialization. Each of the movable blocks, i, has first and second coordinates (e.g. Cartesian coordinates $x_i$, $y_i$). Weights $w_{ij}$ are assigned to nets connecting those of the movable blocks within the subsets. The quadratic initialization in turn includes, as per expression (3), determining a cost of each of the nets connecting any two of the movable blocks within the subsets as one-half of a sum of squares of distances between the any two of the movable blocks (vector form shown in expression (4)). The quadratic initialization further includes minimizing a total cost over all of the nets to determine an initial placement of the set of movable blocks. A further step 787 includes carrying out analytical placement based on the initial placement obtained via the quadratic technique.

In some instances, at least one fixed object 108 is already located at a predetermined location in the bounding box 104, and the determining and minimizing include formulating a cost function (expression (4)) as one-half a transpose of an x-coordinate solution vector times a connectivity matrix times the x-coordinate solution vector (½ $x^T Q x$), plus one-half a transpose of a y-coordinate solution vector times the connectivity matrix times the y-coordinate solution vector (½ $y^T Q y$), plus an x-coordinate fixed object connectivity vector times the x-coordinate solution vector ($d_x^{Tx}$), plus a y-coordinate fixed object connectivity vector times the y-coordinate solution vector ($d_y^T y$); and iteratively minimizing the cost function; for example, by applying conjugate gradient-based optimization or successive over-relaxation (SOR) or the like.

Thus, as discussed above, it will be appreciated that quadratic initialization in accordance with aspects of the invention can be used as a pre-processing step to an analytical placement algorithm in PDS (Placement-driven Synthesis) flows.

In one or more embodiments, a further step includes fabricating a physical integrated circuit in accordance with the analytical placement. One non-limiting specific example of accomplishing this is described elsewhere herein in connection with FIGS. 6 and 9-11. For example, a design structure, based on the analytical placement, is provided to fabrication equipment to facilitate fabrication of a physical integrated circuit in accordance with the design structure.

In one or more embodiments, the putative circuit design is rendered in a design language (e.g. VHDL as seen at 121); and logic synthesis 123 is carried out on the putative circuit design rendered in the design language to determine a number of blocks in the set of movable blocks, the predetermined size of the blocks, and a size of the bounding box. Furthermore, in one or more embodiments, the method further includes carrying out timing optimizations on the analytical placement, as at 127; carrying out routing based on the timing optimizations, as at 129; and preparing a layout based on the routing.

In one or more embodiments, the layout is instantiated as a design structure.

In one or more embodiments, a physical integrated circuit is fabricated in accordance with the design structure.

Figure 9:
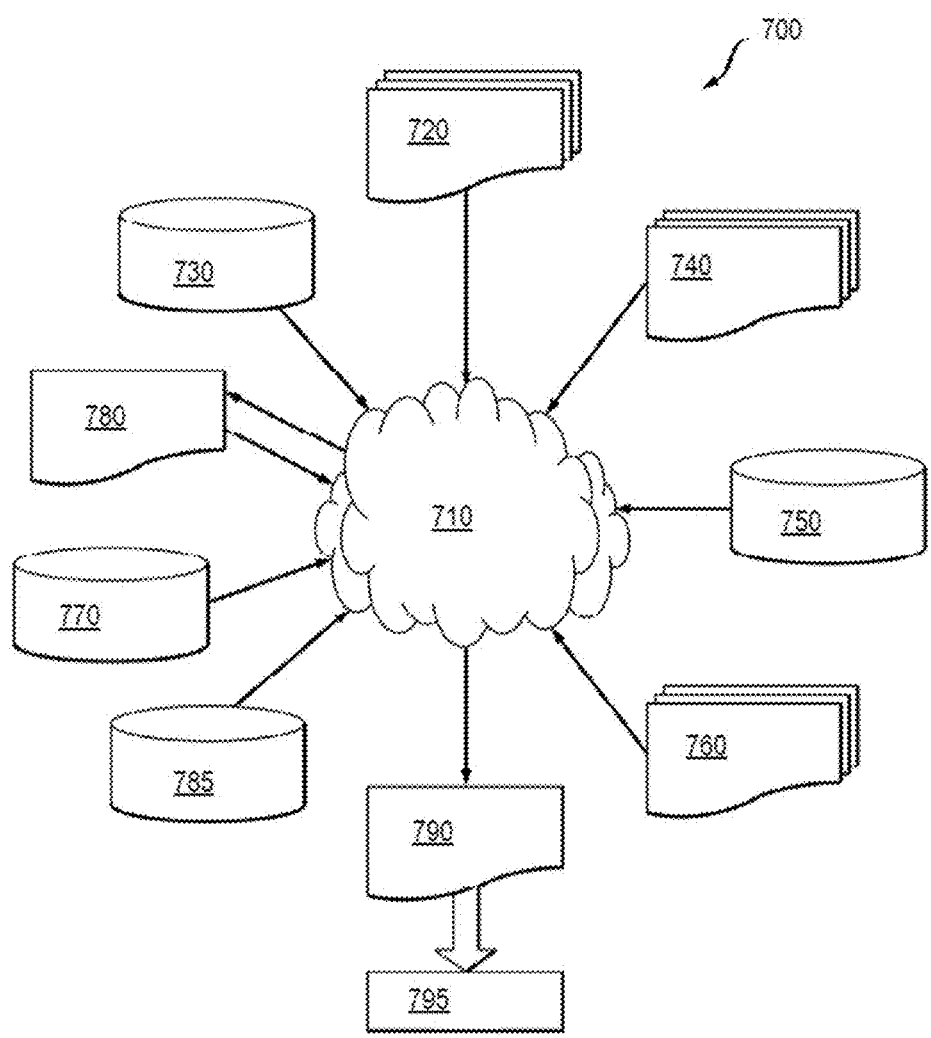
FIG. 9 is a flow diagram of a design process used in semiconductor design, manufacture, and/or test.
Figure 10:
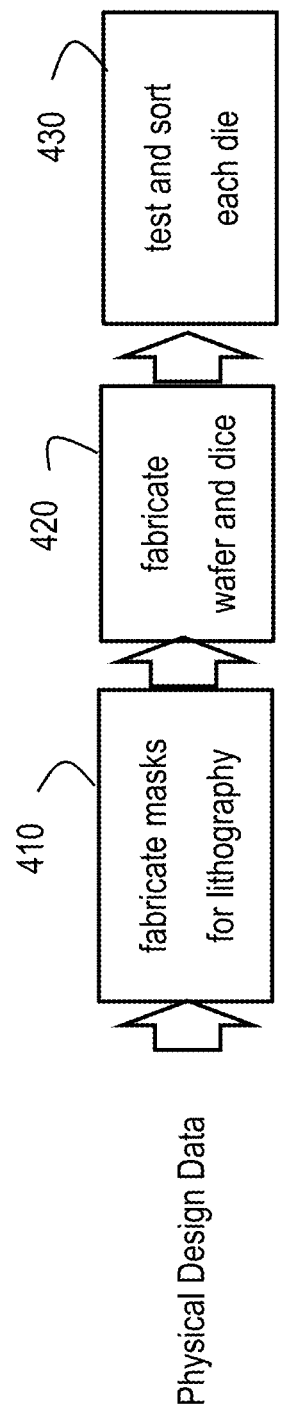
FIG. 10 shows further aspects of IC fabrication from physical design data.

As noted, in one or more embodiments, the layout is instantiated as a design structure. See discussion of FIG. 9. A physical integrated circuit is then fabricated in accordance with the design structure. See again discussion of FIG. 9. Refer also to FIG. 10. Once the physical design data is obtained, based, in part, on the placement processes described herein, an integrated circuit designed in accordance therewith can be fabricated according to known processes that are generally described with reference to FIG. 10. Generally, a wafer with multiple copies of the final design is fabricated and cut (i.e., diced) such that each die is one copy of the integrated circuit. At block 410, the processes include fabricating masks for lithography based on the finalized physical layout. At block 420, fabricating the wafer includes using the masks to perform photolithography and etching. Once the wafer is diced, testing and sorting each die is performed at 430 to filter out any faulty die.

One or more embodiments include a computer including a memory 604; and at least one processor 602, coupled to the memory, and operative to carry out or otherwise facilitate any one, some, or all of the method steps described herein.

In one or more embodiments, the performance (speed) of this computer is improved by quadratic pre-processing prior to the main analytical placement phase, resulting in faster convergence and less CPU time, as compared to prior art techniques. Furthermore, referring to FIG. 9, in one or more embodiments the at least one processor is operative to generate a design structure for the integrated circuit design in accordance with the placement analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of having a shorter total HPWL, less routing congestion, and/or enhanced clock frequency) compared to circuits designed using prior art techniques, at least under conditions where there is the same CPU time budget for the design process. To achieve similar improvements with prior-art techniques, even if possible, would require expenditure of more CPU time as compared to embodiments of the invention.

Figure 11:
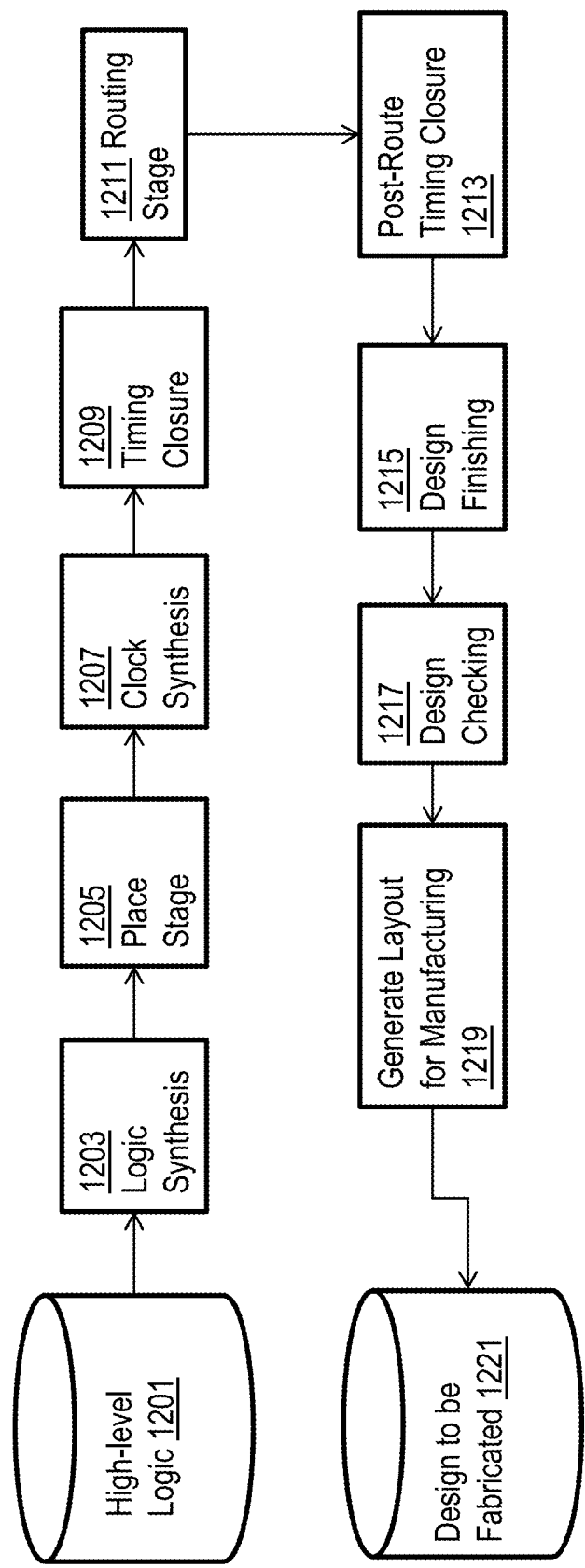
FIG. 11 shows an exemplary high-level Electronic Design Automation (EDA) tool flow, within which aspects of the invention can be employed.

FIG. 11 depicts an example high-level Electronic Design Automation (EDA) tool flow, which is responsible for creating an optimized microprocessor (or other IC) design to be manufactured. A designer could start with a high-level logic description 1201 of the circuit (e.g. VHDL or Verilog). The logic synthesis tool 1203 compiles the logic, and optimizes it without any sense of its physical representation, and with estimated timing information. The placement tool 1205 takes the logical description and places each component, looking to minimize congestion in each area of the design. The clock synthesis tool 1207 optimizes the clock tree network by cloning/balancing/buffering the latches or registers. The timing closure step 1209 performs a number of optimizations on the design, including buffering, wire tuning, and circuit repowering; its goal is to produce a design which is routable, without timing violations, and without excess power consumption. The routing stage 1211 takes the placed/optimized design, and determines how to create wires to connect all of the components, without causing manufacturing violations. Post-route timing closure 1213 performs another set of optimizations to resolve any violations that are remaining after the routing. Design finishing 1215 then adds extra metal shapes to the netlist, to conform with manufacturing requirements. The checking steps 1217 analyze whether the design is violating any requirements such as manufacturing, timing, power, electromigration or noise. When the design is clean, the final step 1219 is to generate a layout for the design, representing all the shapes to be fabricated in the design to be fabricated 1221.

EXEMPLARY SYSTEM

One or more embodiments of the invention, or elements thereof, can be implemented in the form of an apparatus including a memory and at least one processor that is coupled to the memory and operative to perform exemplary method steps.

Figure 8:
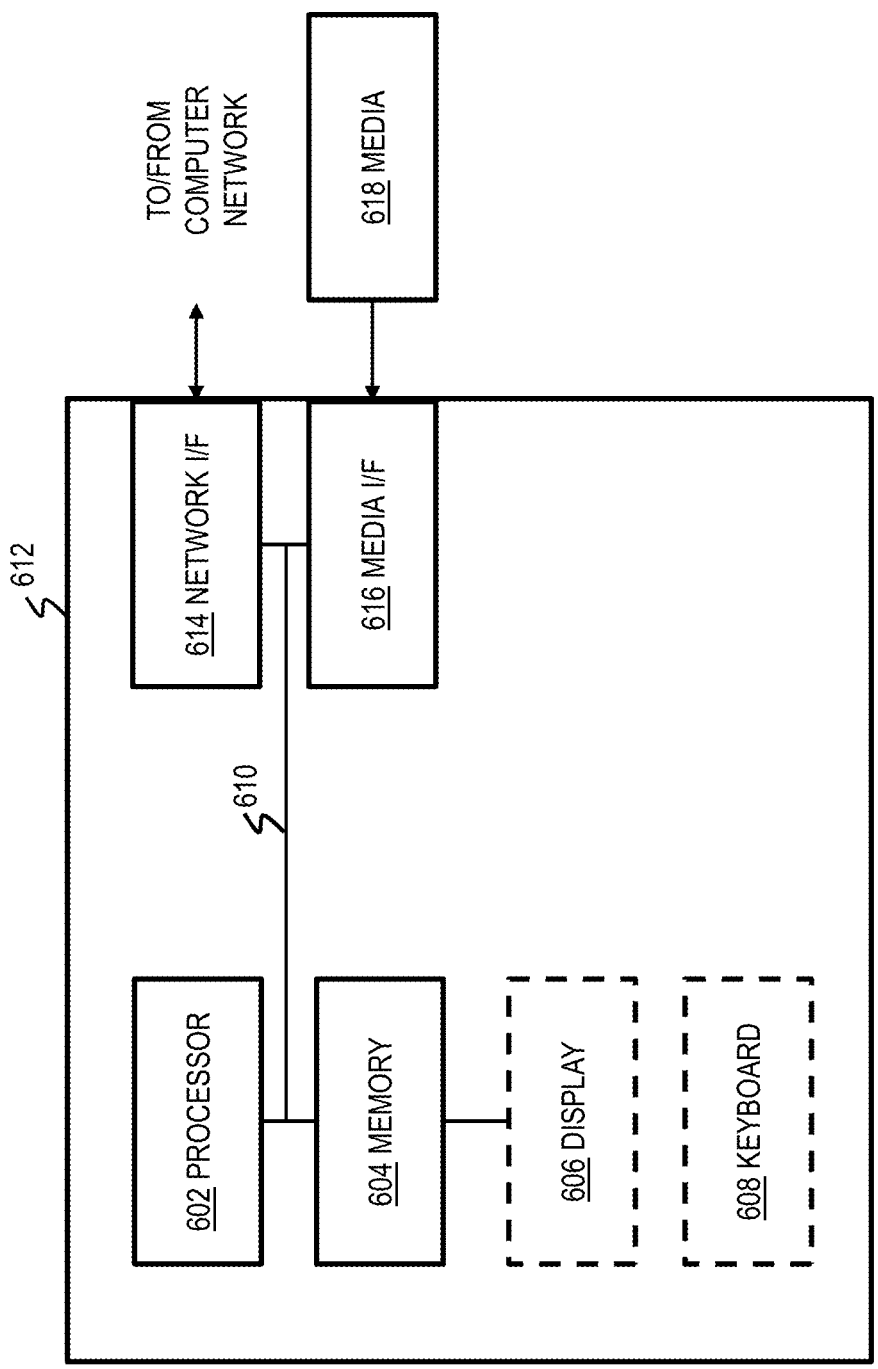
FIG. 8 depicts a computer system that may be useful in implementing one or more aspects and/or elements of the invention.

One or more embodiments can make use of software running on a general purpose computer or workstation. With reference to FIG. 8, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 8) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams and/or described herein. The method steps can then be carried out using the distinct software modules/routines and/or sub-modules/subroutines of the system, as described above, executing on one or more hardware processors 602. Further, a computer program product as described below can include code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

Computer Program Products

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the timing analysis techniques herein with semiconductor integrated circuit design simulation, test, layout, and/or manufacture. In this regard, FIG. 9 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using timing analysis or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved placement can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of improving the performance of a computer performing electronic design analysis, comprising:
  representing a putative circuit design as a set of movable blocks of predetermined size which must fit into a bounding box, said set of movable blocks comprising a plurality of subsets to be interconnected by wires;
  initially placing said set of movable blocks by quadratic initialization, wherein each of said movable blocks has first and second coordinates and weights are assigned to nets connecting those of said movable blocks within said subsets, said quadratic initialization in turn comprising:
    determining a cost of each of said nets connecting any two of said movable blocks within said subsets as one-half of a sum of squares of distances between said any two of said movable blocks; and
    minimizing a total cost over all of said nets to determine an initial placement of said set of movable blocks;
  carrying out analytical placement based on said initial placement.

2. The method of claim 1, wherein at least one fixed object is already located at a predetermined location in said bounding box, and wherein said determining and minimizing comprise:
  formulating a cost function as one-half a transpose of an x-coordinate solution vector times a connectivity matrix times said x-coordinate solution vector, plus one-half a transpose of a y-coordinate solution vector times said connectivity matrix times said y-coordinate solution vector, plus an x-coordinate fixed object connectivity vector times said x-coordinate solution vector, plus a y-coordinate fixed object connectivity vector times said y-coordinate solution vector; and
  iteratively minimizing said cost function.

3. The method of claim 2, wherein minimizing said cost function comprises applying conjugate gradient-based optimization.

4. The method of claim 2, wherein minimizing said cost function comprises applying successive over-relaxation (SOR).

5. The method of claim 1, further comprising fabricating a physical integrated circuit in accordance with said analytical placement.

6. The method of claim 1, further comprising:
rendering said putative circuit design in a design language; and
carrying out logic synthesis on said putative circuit design rendered in said design language to determine a number of blocks in said set of movable blocks, said predetermined size of said blocks, and a size of said bounding box.

7. The method of claim 6, further comprising:
carrying out timing optimizations on said analytical placement;
carrying out routing based on said timing optimizations; and
preparing a layout based on said routing.

8. The method of claim 7, further comprising:
instantiating said layout as a design structure.

9. The method of claim 8, further comprising fabricating a physical integrated circuit in accordance with said design structure.

10. A non-transitory computer readable medium comprising computer executable instructions which when executed by a computer performing electronic design analysis cause the computer to perform a method which improves the performance of the computer, the method comprising:
representing a putative circuit design as a set of movable blocks of predetermined size which must fit into a bounding box, said set of movable blocks comprising a plurality of subsets to be interconnected by wires;
initially placing said set of movable blocks by quadratic initialization, wherein each of said movable blocks has first and second coordinates and weights are assigned to nets connecting those of said movable blocks within said subsets, said quadratic initialization in turn comprising:
determining a cost of each of said nets connecting any two of said movable blocks within said subsets as one-half of a sum of squares of distances between said any two of said movable blocks; and
minimizing a total cost over all of said nets to determine an initial placement of said set of movable blocks;
carrying out analytical placement based on said initial placement.

11. The non-transitory computer readable medium of claim 10, wherein at least one fixed object is already located at a predetermined location in said bounding box, and wherein said determining and minimizing comprise:
formulating a cost function as one-half a transpose of an x-coordinate solution vector times a connectivity matrix times said x-coordinate solution vector, plus one-half a transpose of a y-coordinate solution vector times said connectivity matrix times said y-coordinate solution vector, plus an x-coordinate fixed object connectivity vector times said x-coordinate solution vector, plus a y-coordinate fixed object connectivity vector times said y-coordinate solution vector; and
iteratively minimizing said cost function.

12. The non-transitory computer readable medium of claim 10, wherein said method further comprises:
rendering said putative circuit design in a design language;
carrying out logic synthesis on said putative circuit design rendered in said design language to determine a number of blocks in said set of movable blocks, said predetermined size of said blocks, and a size of said bounding box;
carrying out timing optimizations on said analytical placement;
carrying out routing based on said timing optimizations;
preparing a layout based on said routing; and
instantiating said layout as a design structure to facilitate fabricating a physical integrated circuit in accordance with said design structure.

13. A computer comprising:
a memory; and
at least one processor, coupled to said memory, and operative to:
represent a putative circuit design as a set of movable blocks of predetermined size which must fit into a bounding box, said set of movable blocks comprising a plurality of subsets to be interconnected by wires;
initially place said set of movable blocks by quadratic initialization, wherein each of said movable blocks has first and second coordinates and weights are assigned to nets connecting those of said movable blocks within said subsets, said quadratic initialization in turn comprising:
determining a cost of each of said nets connecting any two of said movable blocks within said subsets as one-half of a sum of squares of distances between said any two of said movable blocks; and
minimizing a total cost over all of said nets to determine an initial placement of said set of movable blocks;
carrying out analytical placement based on said initial placement.

14. The computer of claim 13, wherein at least one fixed object is already located at a predetermined location in said bounding box, and wherein said determining and minimizing comprise:
formulating a cost function as one-half a transpose of an x-coordinate solution vector times a connectivity matrix times said x-coordinate solution vector, plus one-half a transpose of a y-coordinate solution vector times said connectivity matrix times said y-coordinate solution vector, plus an x-coordinate fixed object connectivity vector times said x-coordinate solution vector, plus a y-coordinate fixed object connectivity vector times said y-coordinate solution vector; and
iteratively minimizing said cost function.

15. The computer of claim 14, wherein minimizing said cost function comprises applying conjugate gradient-based optimization.

16. The computer of claim 14, wherein minimizing said cost function comprises applying successive over-relaxation (SOR).

17. The computer of claim 13, wherein said at least one processor is further operative to:
render said putative circuit design in a design language; and
carry out logic synthesis on said putative circuit design rendered in said design language to determine a number of blocks in said set of movable blocks, said predetermined size of said blocks, and a size of said bounding box.

18. The computer of claim 17, wherein said at least one processor is further operative to:
   carry out timing optimizations on said analytical placement;
   carry out routing based on said timing optimizations; and
   prepare a layout based on said routing.

19. The computer of claim 18, wherein said at least one processor is further operative to:
   instantiate said layout as a design structure.

20. The computer of claim 19, wherein said at least one processor is further operative to:
   provide said design structure, based on said analytical placement, to fabrication equipment to facilitate fabrication of a physical integrated circuit in accordance with said design structure.

* * * * *